(12) United States Patent
Seino

(10) Patent No.: US 9,177,825 B2
(45) Date of Patent: Nov. 3, 2015

(54) PATTERN FORMING METHOD

(71) Applicant: KABUSHIKI KAISHA TOSHIBA, Tokyo (JP)

(72) Inventor: Yuriko Seino, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/467,213

(22) Filed: Aug. 25, 2014

(65) Prior Publication Data

US 2015/0262837 A1   Sep. 17, 2015

(30) Foreign Application Priority Data

Mar. 14, 2014   (JP) .................................. 2014-052138

(51) Int. Cl.
| | |
|---|---|
| *H01L 21/311* | (2006.01) |
| *H01L 21/027* | (2006.01) |
| *H01L 21/02* | (2006.01) |

(52) U.S. Cl.
CPC ...... *H01L 21/31144* (2013.01); *H01L 21/0275* (2013.01); *H01L 21/02118* (2013.01); *H01L 21/31138* (2013.01)

(58) Field of Classification Search
CPC ...... B82Y 40/00; B82Y 30/00; G03F 7/0002; G03F 7/40; G03F 7/0035; G03F 7/165; G03F 7/2059; H01L 21/0338; H01L 21/31144; H01L 21/32139; H01L 21/308; H01L 21/0271; H01L 21/0274; H01L 21/30604; B81C 1/00031; B81C 2201/0149

USPC .......................................... 430/322, 312, 394
See application file for complete search history.

(56) References Cited

U.S. PATENT DOCUMENTS

| 2009/0155725 A1* | 6/2009 | Yi et al. ....................... 430/312 |
| 2013/0078576 A1 | 3/2013 | Wu et al. |
| 2013/0196511 A1 | 8/2013 | Nishimura et al. |

FOREIGN PATENT DOCUMENTS

| JP | 3967114 | 8/2007 |
| JP | 4654279 | 3/2011 |
| JP | 4673266 | 4/2011 |
| JP | 2013-212489 | 10/2013 |

OTHER PUBLICATIONS

Lui C., "Towards an all-track 300 mm process for directed self-assembly", Journal of Vacuum Science & Technology B, vol. 29, pp. 06F203-1 to 06F203-6, Oct. 18, 2011.

* cited by examiner

*Primary Examiner* — Caleen Sullivan
(74) *Attorney, Agent, or Firm* — Finnegan, Henderson, Farabow, Garrett & Dunner, LLP

(57) ABSTRACT

According to one embodiment, a pattern forming method includes forming, on an underlying region, a neutral film having an affinity for first and second polymers, forming a first pinning part having an affinity for the first polymer by irradiating a first region of the neutral film with an energy beam, forming, on the neutral film including the first pinning part, a block copolymer film containing the first and second polymers, and performing a predetermined treatment for the block copolymer film to perform a microphase separation.

20 Claims, 8 Drawing Sheets

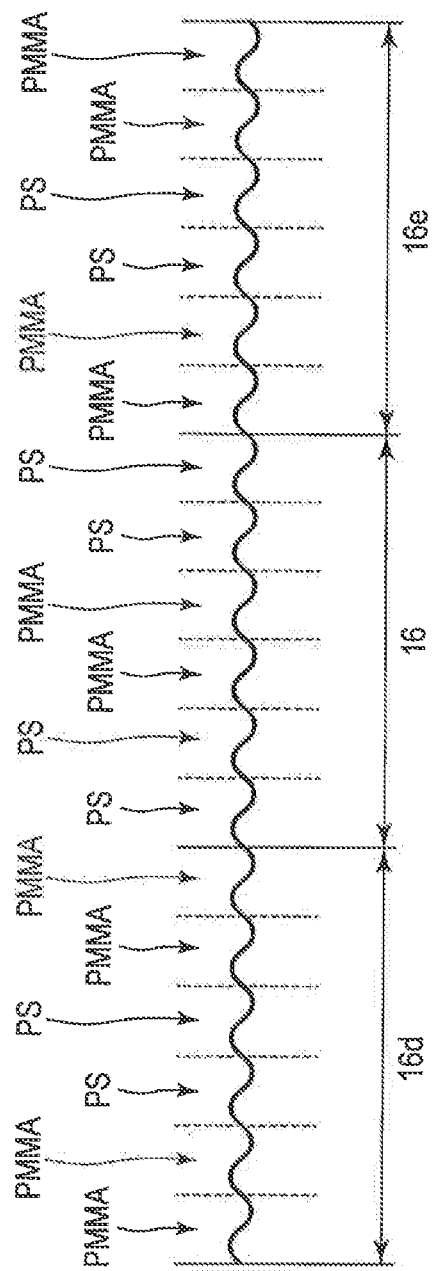
F I G. 9

PATTERN FORMING METHOD

CROSS-REFERENCE TO RELATED APPLICATIONS

This application is based upon and claims the benefit of priority from Japanese Patent Application No. 2014-052138, filed Mar. 14, 2014, the entire contents of which are incorporated herein by reference.

FIELD

Embodiments described herein relate generally to a pattern forming method.

BACKGROUND

As a lithographic technique of a semiconductor device, a method of using directed self-assembly (DSA) has been proposed.

However, there have been problems with the conventional method of using DSA in that a long process is required and it is difficult to form a desired pattern.

It is therefore desirable to provide a lithographic method capable of forming a desired pattern by a short process.

BRIEF DESCRIPTION OF THE DRAWINGS

FIG. 9 is a schematic view illustrating an arrangement of PMMA and PS of the first embodiment;

DETAILED DESCRIPTION

In general, according to one embodiment, a pattern forming method includes: forming, on an underlying region, a neutral film having an affinity for first and second polymers; forming a first pinning part having an affinity for the first polymer by irradiating a first region of the neutral film with an energy beam; forming, on the neutral film including the first pinning part, a block copolymer film containing the first and second polymers; forming, on the first pinning part, a pattern including first and second portions formed of the first polymer and a third portion provided between the first and second portions and formed of the second polymer, by performing a predetermined treatment for the block copolymer film to perform a microphase separation; and removing the first and second portions or removing the third portion.

Various embodiments will be described hereinafter with reference to the accompanying drawings.

First Embodiment

FIGS. 1 to 8 are schematic cross-sectional views illustrating a pattern forming method of the first embodiment. The method of the first embodiment is applicable to forming a line-and-space pattern in a semiconductor device.

Figure 1:
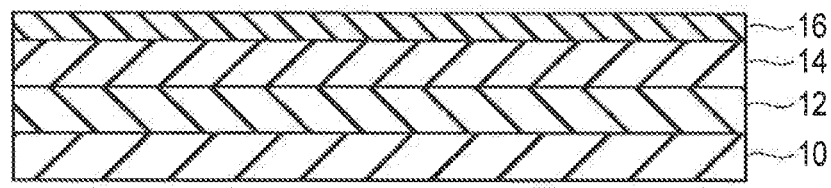
FIG. 1 is a schematic cross-sectional view illustrating a part of a pattern forming method of a first embodiment.

To begin with, as shown in FIG. 1, a silicon oxide film having a thickness of approximately 100 nm as a film 10 to be processed is formed on a semiconductor substrate (not shown). On the silicon oxide film 10, a spin-on carbon film (SOC film) 12 having a thickness of approximately 150 nm is formed. Further, on the SOC film 12, a spin-on glass film (SOG film) 14 having a thickness of approximately 35 nm is formed.

Next, on the SOG film 14 that serves as an underlying region, a neutral film 16 having a thickness of approximately 6 nm is formed. In detail, a solution in which 0.05 wt % of P (S-r-MMA)-OH (hydroxy terminated poly (styrene-random-methyl methacrylate)) is dissolved in polyethylene glycol monomethyl ether acetate (PGMEA) is prepared, and this solution is rotated at 1500 rpm, applied on the SOG film 14 and then heated at 240° C. for one minute. On the SOG film 14, the neutral film 16 having a thickness of approximately 6 nm is thereby formed. The neutral film 16 has an affinity for polymethyl methacrylate (PMMA, first polymer) and polystyrene (PS, second polymer), which will be described later.

Figure 2:
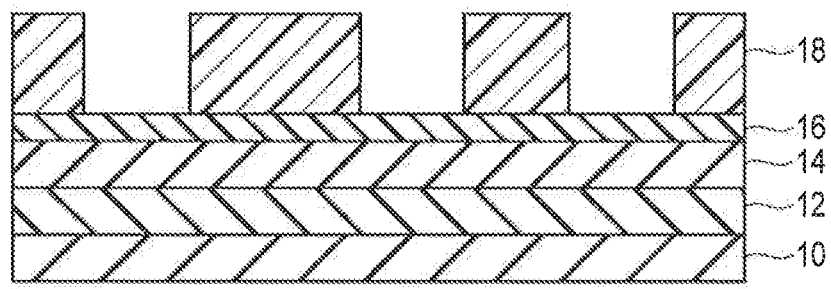
FIG. 2 is a schematic cross-sectional view illustrating a part of the pattern forming method of the first embodiment.

Subsequently, as shown in FIG. 2, a positive resist having a thickness of approximately 100 nm is applied on the neutral film 16. The positive resist is then exposed by immersion exposure at 15 mJ/cm$^2$ using an ArF excimer laser. Further, development is performed by using a TMAH solution to form a resist pattern 18. The resist pattern 18 includes a line-and-space pattern (L/S pattern) having a pitch of 45 nm.

Figure 3:
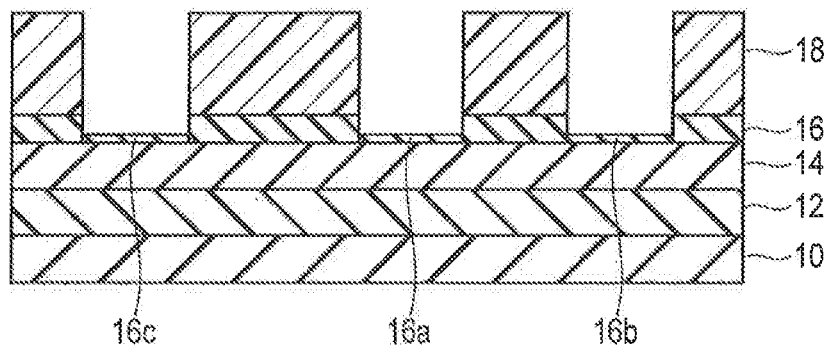
FIG. 3 is a schematic cross-sectional view illustrating a part of the pattern forming method of the first embodiment.

Thereafter, as shown in FIG. 3, the resist pattern 18 is used as a mask to etch the neutral film 16 and reduce the thickness of the neutral film 16. In detail, the thickness of the neutral film 16 is reduced by reactive ion etching (RIE) using oxygen (O$_2$) gas. Thus, by reducing the thickness of the preliminarily formed neutral film 16, a region 16a (first region), a region 16b (second region) and a region 16c, where the neutral film 16 is thin, are formed.

Figure 4:
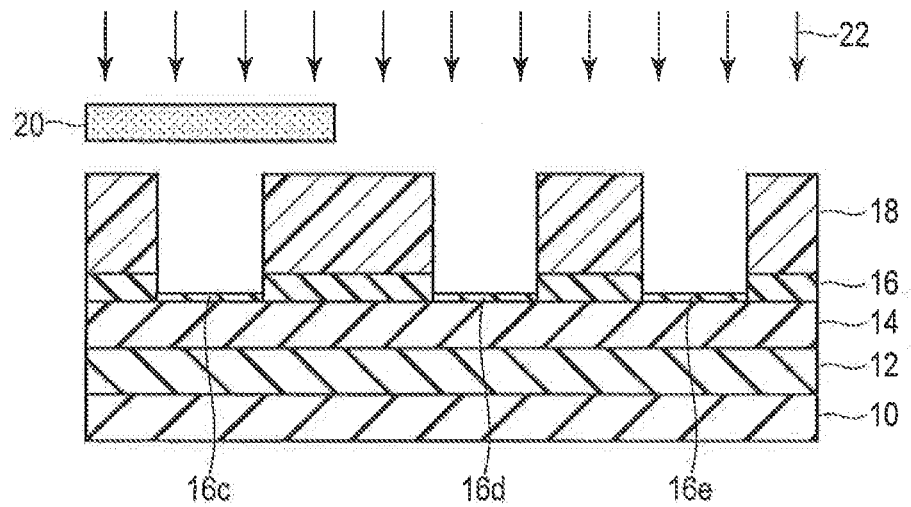
FIG. 4 is a schematic cross-sectional view illustrating a part of the pattern forming method of the first embodiment.

Next, as shown in FIG. 4, the resist pattern 18 and a cover mask 20 are used as a mask to irradiate the regions 16a and 16b of the neutral film with an energy beam 22. In detail, the electron beam (EB) 22 is used as an energy beam to perform electron beam irradiation at a voltage of 800 V and a current of 5 pA. The cover mask 20 is arranged above the region 16c of the neutral film so that the region 16c is not irradiated with the electron beam 22. By this electron beam irradiation, a pinning part 16d (first pinning part) and a pinning part 16e (second pinning part) having an affinity for PMMA (first polymer) are formed in the regions 16a and 16b.

Figure 5:
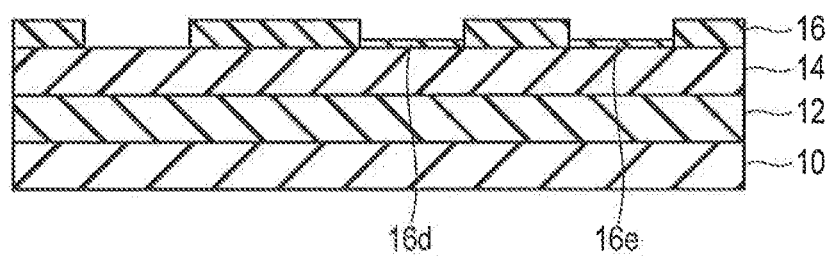
FIG. 5 is a schematic cross-sectional view illustrating a part of the pattern forming method of the first embodiment.

Subsequently, as shown in FIG. 5, the resist pattern 18 is removed by using PGMEA thinner. Since the region 16c of the neutral film is thin at this time, the region 16c is also removed by PGMEA thinner. The regions (pinning parts) 16d and 16e of the neutral film remain without being removed since the regions are modified by electron beam irradiation.

Figure 6:
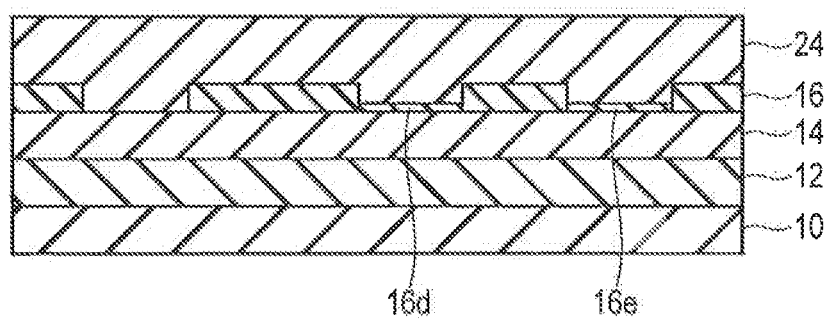
FIG. 6 is a schematic cross-sectional view illustrating a part of the pattern forming method of the first embodiment.

Thereafter, as shown in FIG. 6, a block copolymer film 24 is formed on the neutral film 16 comprising the pinning parts 16d and 16e. The block copolymer film 24 contains PMMA (first polymer) and PS (second polymer). In detail, PS-b-PMMA(poly(styrene-block-methyl methacrylate)) whose volume composition ratio of PMMA to PS is 1:1 is prepared to 1.0 wt % by a PGMEA solution, and the prepared solution is rotated at 1500 rpm and applied in a thickness of 45 nm.

Figure 7:
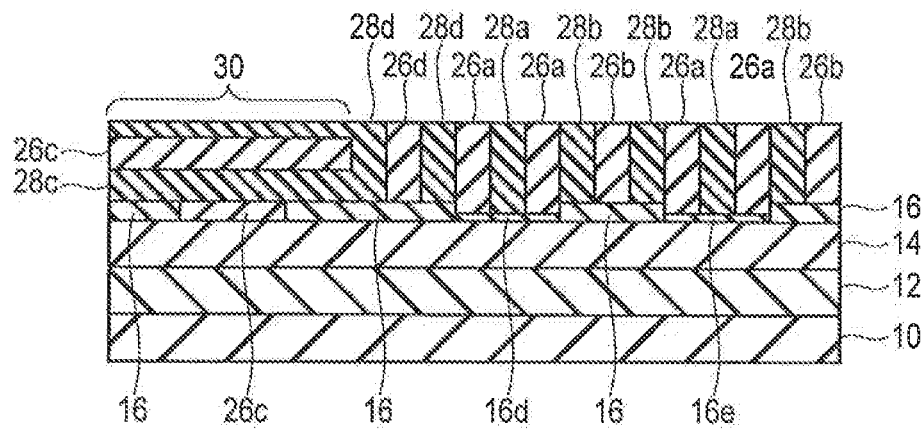
FIG. 7 is a schematic cross-sectional view illustrating a part of the pattern forming method of the first embodiment.

Next, as shown in FIG. 7, heat treatment is performed for the block copolymer film 24 as a predetermined treatment. In detail, baking is performed at 110° C. for 60 seconds, and annealing is performed at 240° C. for two minutes in a nitrogen ($N_2$) gas atmosphere. Such a treatment allows the block copolymer film 24 to be microphase-separated.

In detail, on the pinning parts 16d and 16e, a pattern comprising PMMA portions 26a (first, second, fourth and fifth portions) formed by PMMA and PS portions 28a (third and sixth portions) is formed. Each of the PS portions 28a are provided between two of the PMMA portions 26a. Also, on the region of the neutral film 16 between the pinning part 16d and the pinning part 16e, a pattern comprising PS portions 28b (seventh and eighth portions) formed by PS and a PMMA portion 26b (ninth portion) formed by PMMA is formed. The PMMA portion 26b is provided between two of the PS portions 28b.

Also, in a predetermined region outside the pinning parts 16d and 16e, a horizontal lamella orientation section 30 is formed. In the horizontal lamella orientation section 30, PMMA portions 26c and a PS portion 28c are alternately stacked.

Further, in a region adjacent to the horizontal lamella orientation section 30, a region formed by a PMMA portion 26d and PS portions 28d is formed.

The structure of FIG. 7 mentioned above will be described in detail below.

Since the neutral film 16 contains PMMA components and PS components, the water contact angle of the neutral film (approximately 800) is intermediate between that of PMMA (approximately 70°) and that of PS (approximately 90°). Therefore, both PMMA and PS have an affinity for the neutral film. However, when the neutral film is irradiated with an electron beam and the surface of the neutral film is modified to achieve PMMA affinity, PMMA preferentially adheres to the surface of the neutral film (pinning part) irradiated with the electron beam.

A unit of a block copolymer is a state where a PMMA molecule and a PS molecule are bound. Therefore, when PMMA preferentially adheres to the pinning part, PS bound with PMMA also adheres. At this time, PMMA adheres to the end of the pinning part. Also, PMMA is bound with PMMA and PS is bound with PS. As a result, as shown in FIG. 9, a sequence PMMA-PMMA-PS-PS-PMMA-PMMA is obtained in the pinning parts 16d and 16e. Also, a sequence PS-PS-PMMA-PMMA-PS-PS is obtained in the neutral film 16, which is provided between the pinning parts 16d and 16e.

Therefore, it is possible to realize the sequence of PMMA and PS shown in FIG. 7 by optimizing the relationship between the length of PMMA and PS and the width of the pinning part and the distance between the pinning parts adjacent to each other.

On the other hand, in a region where the region 16c of the neutral film (see FIG. 3) is removed, the underlying film (SOG film 14) is exposed. As a result, the horizontal lamella orientation section 30, where a PMMA phase is made the lowermost layer, is formed in a region where the region 16c of the neutral film is removed.

The structure shown in FIG. 7 is thus obtained.

Figure 8:
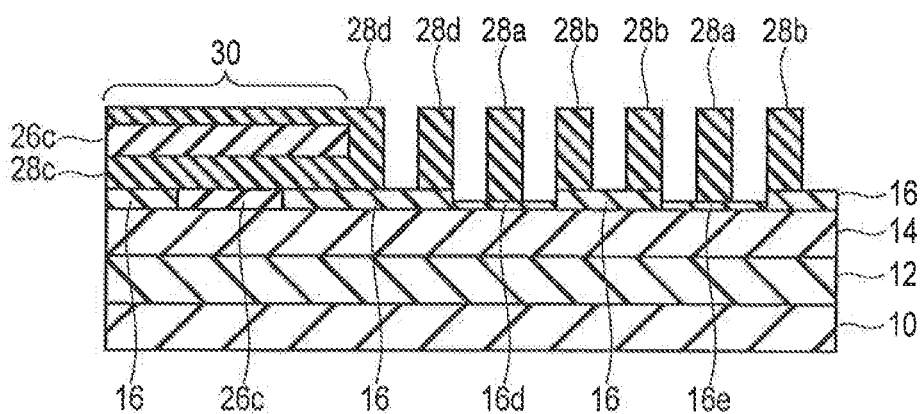
FIG. 8 is a schematic cross-sectional view illustrating a part of the pattern forming method of the first embodiment.

Next, as shown in FIG. 8, the PMMA portions 26a, 26b and 26d are removed by RIE using oxygen ($O_2$), and the PS portions 28a, 28b, 28c and 28d are left. A line-and-space pattern (L/S pattern) having a half pitch of 15 nm is thereby obtained.

In the following process (not shown), the PS portions 28a, 28b, 28c and 28d are used as a mask to etch the SOG film 14 and the SOC film 12. The patterns of the PS portions 28a, 28b, 28c and 28d are thereby transferred to the SOG film 14 and the SOC film 12. Further, a line-and-space pattern (L/S pattern) is obtained by using the patterns of the SOG film 14 and the SOC film 12 as a mask to etch the film 10.

As mentioned above, according to the first embodiment, the neutral film 16 is irradiated with an energy beam such as an electron beam to form the pinning parts 16d and 16e having an affinity for PMMA. By performing a predetermined treatment (heat treatment) for the block copolymer film 24 containing PMMA (first polymer) and PS (second polymer), it is possible to preferentially adhere PMMA to the pinning parts 16d and 16e. As a result, by optimizing the width of the pinning parts 16d and 16e and the distance between the pinning parts 16d and 16e, it is possible to form a pattern where the PMMA portions and the PS portions are alternately arranged. Therefore, after forming such a pattern, it is possible to form a fine pattern (line-and-space pattern) with fewer processes by selectively removing the PMMA portions and leaving the PS portions.

Also, by reducing the thickness of the neutral film 16, it is possible to remove the neutral film in a region where a horizontal lamella orientation section is formed and therefore to form a horizontal lamella orientation section effectively. By forming a horizontal lamella orientation section, it is possible to form a pattern other than a line-and-space pattern (for example, a peripheral circuit pattern) in a horizontal lamella orientation section.

Note that while PMMA affinity is achieved for the pinning parts 16d and 16e by electron beam irradiation in the first embodiment, it can be modified to PS affinity. Also, the neutral film 16 between the pinning parts 16d and 16e can be modified to achieve PS affinity and PMMA affinity by electron beam irradiation and to be a pinning part.

Further, while the PMMA portions 26a, 26b and 26d are removed and the PS portions 28a, 28b, 28c and 28d are left in the process of FIG. 8 in the first embodiment, it may be possible that the PS portions 28a, 28b, 28c and 28d are removed and the PMMA portions 26a, 26b, 26c and 26d are left.

Furthermore, while the thickness of the neutral film 16 is reduced to form the regions 16a, 16b and 16c in the process of FIG. 3, it is not necessary to reduce the thickness of the neutral film 16 if it is not necessary to form the horizontal lamella orientation section 30. Even in such a case, as shown in the process of FIG. 4, it is possible to form a pinning part by electron beam irradiation and to form the same line-and-space pattern as mentioned in the first embodiment.

Second Embodiment

FIGS. 10 to 17 are schematic cross-sectional views illustrating the pattern forming method of the second embodiment. Note that, since the method of the second embodiment is basically the same as that of the first embodiment mentioned above, the explanation already given for the first embodiment will be omitted. The method of the second embodiment is applicable to forming a hole pattern in a semiconductor device.

Figure 10:
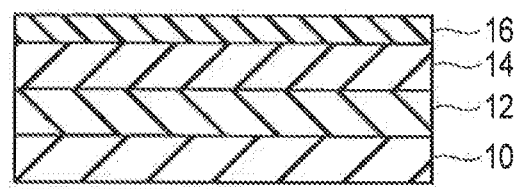
FIG. 10 is a schematic cross-sectional view illustrating a part of a pattern forming method of a second embodiment.

To begin with, as shown in FIG. 10, the film 10, the spin-on carbon film (SOC film) 12 and the spin-on glass film (SOG film) 14 are formed on a semiconductor substrate (not shown) as in the first embodiment. Further, on the SOG film 14, the neutral film 16 having an affinity for PMMA and PS is formed.

Figure 11:
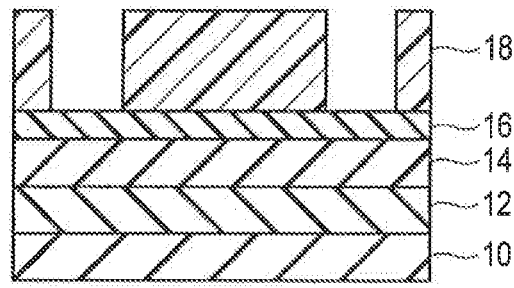
FIG. 11 is a schematic cross-sectional view illustrating a part of the pattern forming method of the second embodiment.

Next, as shown in FIG. 11, the resist pattern 18 is formed on the neutral film 16 as in the first embodiment. The resist pattern 18 includes a hole pattern.

Figure 12:
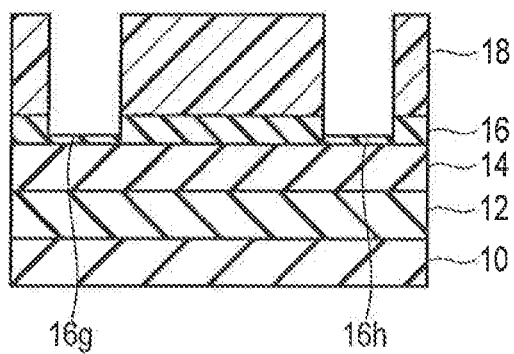
FIG. 12 is a schematic cross-sectional view illustrating a part of the pattern forming method of the second embodiment.

Subsequently, as shown in FIG. 12, the resist pattern 18 is used as a mask to etch the neutral film 16 and reduce the thickness of the neutral film 16 as in the first embodiment. As a result, a region 16g (first region) and a region 16h (second region), where the neutral film 16 is thin, are formed.

Figure 13:
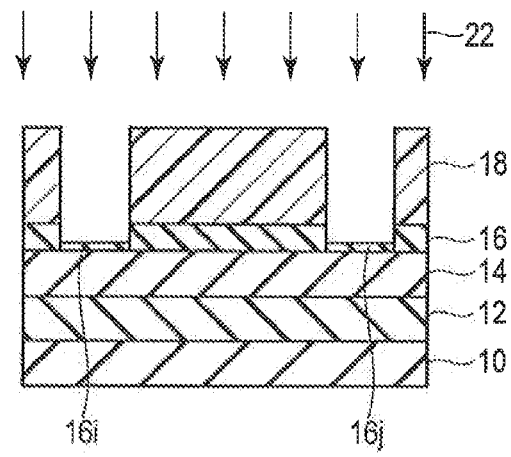
FIG. 13 is a schematic cross-sectional view illustrating a part of the pattern forming method of the second embodiment.

Thereafter, as shown in FIG. 13, the resist pattern 18 is used as a mask to irradiate the regions 16g and 16h of the neutral film with the energy beam 22 as in the first embodiment. By this electron beam irradiation, a pinning part 16i (first pinning part) and a pinning part 16j (second pinning part) having an affinity for PMMA are formed in the regions 16g and 16h.

Figure 14:
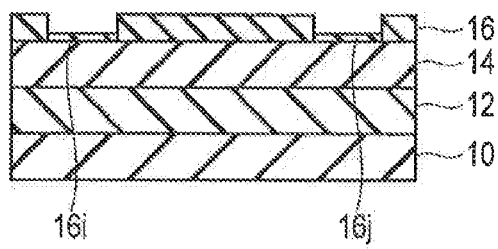
FIG. 14 is a schematic cross-sectional view illustrating a part of the pattern forming method of the second embodiment.
Figure 18:
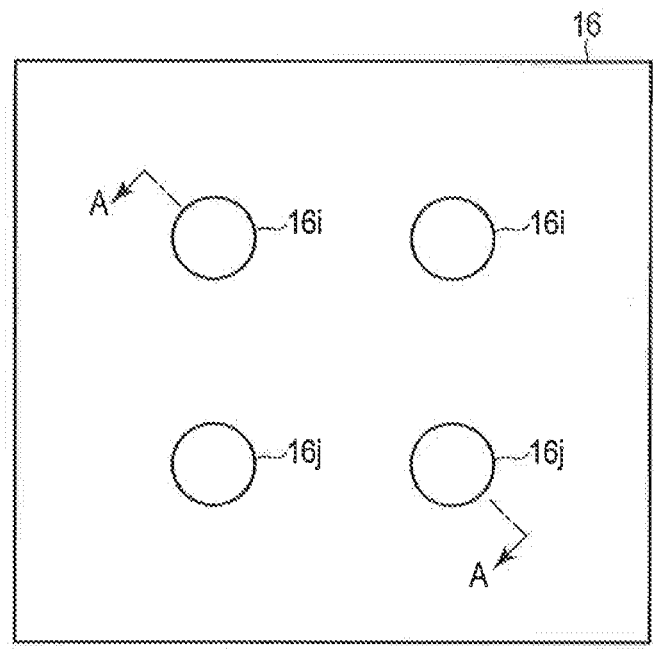
FIG. 18 is a plan view corresponding to the process of FIG. 14 of the second embodiment.

Then, as shown in FIG. 14, the resist pattern 18 is removed as in the first embodiment. FIG. 18 is a plan view corresponding to FIG. 14. The cross-section along line A-A in FIG. 18 corresponds to FIG. 14. As shown in FIGS. 14 and 18, the pinning parts 16i and 16j are surrounded by the neutral film 16.

Figure 15:
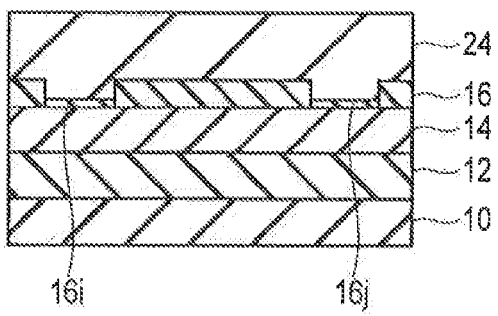
FIG. 15 is a schematic cross-sectional view illustrating a part of the pattern forming method of the second embodiment.

Next, as shown in FIG. 15, the block copolymer film 24 containing PMMA (first polymer) and PS (second polymer) is formed on the neutral film 16 comprising the pinning parts 16i and 16j as in the first embodiment.

Figure 16:
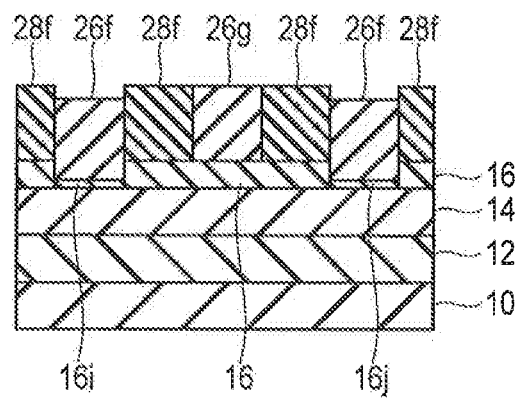
FIG. 16 is a schematic cross-sectional view illustrating a part of the pattern forming method of the second embodiment.

Subsequently, as shown in FIG. 16, a predetermined treatment (heat treatment) is performed for the block copolymer film 24 as in the first embodiment. Such a treatment allows the block copolymer film 24 to be microphase-separated.

In detail, a pattern formed by PMMA is formed on the pinning part 16i, on the pinning part 16j and on a portion between the pinning parts 16i and 16j, which is a portion separated from the pinning parts 16i and 16j. That is, PMMA portions 26f are formed on the pinning parts 16i and 16j, and each of PMMA portions 26g is formed in the middle of two of the PMMA portions 26f. Also, PS portions 28f are formed around the PMMA portions 26f and 26g.

Figure 19:
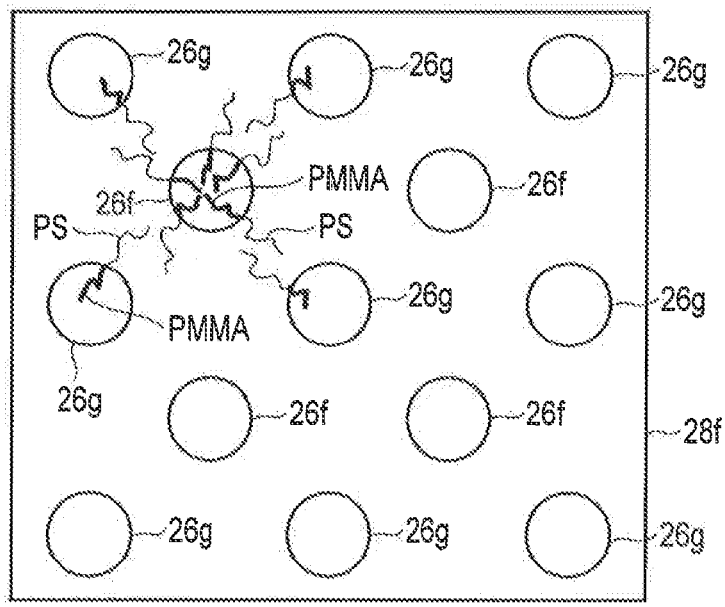
FIG. 19 is a plan view corresponding to the process of FIG. 16 of the second embodiment.

While PMMA has an affinity for the neutral film surface (pinning part) irradiated with an electron beam as mentioned above, PS does not have an affinity or has a low affinity. Therefore, PMMA preferentially adheres to the pinning part. Accordingly, by optimizing the size (diameter) of the pinning parts 16i and 16j, only PMMA adheres to the pinning parts 16i and 16j to form the PMMA portions 26f as shown in FIG. 19 (plan view corresponding to FIG. 16). A unit of a block copolymer is a state where a PMMA molecule and a PS molecule are bound. Therefore, when PMMA preferentially adheres to the pinning parts 16i and 16j, PS bound with PMMA adheres to the surface of the neutral film 16 around the pinning parts 16i and 16j.

Also, by optimizing the distance between the pinning parts 16i and 16j, it is possible to form the PMMA portions 26g on a portion between the pinning parts 16i and 16j. In detail, each of the PMMA portions 26g are formed on a portion of the middle of the four pinning parts adjacent to each other.

The structure shown in FIG. 16 is thus obtained.

Figure 17:
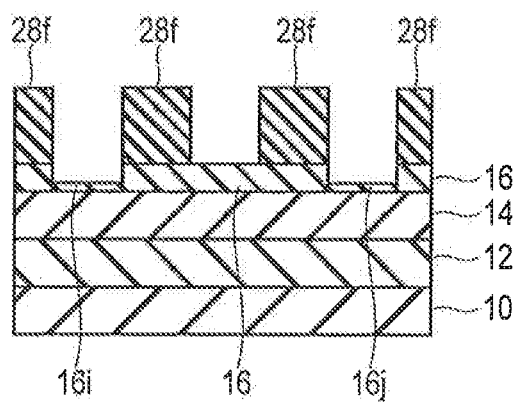
FIG. 17 is a schematic cross-sectional view illustrating a part of the pattern forming method of the second embodiment.

Next, as shown in FIG. 17, the PMMA portions 26f and 26g are removed and the PS portions 28f are left as in the first embodiment. It is thereby possible to obtain a hole pattern having a pitch the half of the pitch of the hole pattern formed in the process of FIG. 11.

In the following process (not shown), the PS portions 28f are used as a mask to etch the SOG film 14 and the SOC film 12. The patterns of the PS portions 28f are thereby transferred to the SOG film 14 and the SOC film 12. Further, a hole pattern is obtained by using the patterns of the SOG film 14 and the SOC film 12 as a mask to etch the film 10.

As mentioned above, according to the second embodiment, the neutral film 16 is irradiated with an energy beam such as an electron beam to form the pinning parts 16i and 16j having an affinity for PMMA. By performing a predetermined treatment (heat treatment) for the block copolymer film 24 containing PMMA (first polymer) and PS (second polymer), it is possible to preferentially adhere PMMA to the pinning parts 16i and 16j. Also, by optimizing the size (diameter) of the pinning parts 16i and 16j and the distance between the pinning parts 16i and 16j, it is possible to form PMMA portions on the pinning part 16i, on the pinning part 16j and on a portion between the pinning parts 16i and 16j. Therefore, after forming such a pattern, it is possible to form a fine pattern (hole pattern) with fewer processes by selectively removing the PMMA portions and leaving the PS portions.

Note in the second embodiment that while a horizontal lamella orientation section is not particularly mentioned, it is possible to form a horizontal lamella orientation section as in the first embodiment. Also, it is not necessary to perform a process of reducing the thickness of the neutral film 16 of FIG. 12, if it is not necessary to form a horizontal lamella orientation section. Even in such a case, as shown in the process of FIG. 13, it is possible to form a pinning part by electron beam irradiation and to form the same hole pattern as mentioned in the second embodiment.

Also, while an electron beam is used as an energy beam in the first and second embodiments mentioned above, it is possible to use light such as DUV as the energy beam.

Further, while the resist pattern 18 is formed by immersion exposure using an ArF excimer laser in the first and second embodiments mentioned above, it is possible to use other lithographic methods. For example, it is possible to form the resist pattern 18 by lithography using EUV light and nanoimprint lithography.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming, on an underlying region, a neutral film having an affinity for first and second polymers;
    forming a first pinning part having an affinity for the first polymer by irradiating a first region of the neutral film with an energy beam;
    forming, on the neutral film including the first pinning part, a block copolymer film containing the first and second polymers;
    forming, on the first pinning part, a pattern including first and second portions formed of the first polymer and a third portion provided between the first and second portions and formed of the second polymer, by performing a predetermined treatment for the block copolymer film to perform a microphase separation; and
    removing the first and second portions or removing the third portion,
    wherein forming the neutral film includes:
        forming a preliminary neutral film; and
        thinning a portion of the preliminary neutral film, which is formed in the first region.

2. The method of claim 1, wherein
a horizontal lamella orientation section is formed in a predetermined region outside the first pinning part in performing the predetermined treatment for the block copolymer film.

3. The method of claim 2, wherein
the horizontal lamella orientation section includes a structure in which a portion formed of the first polymer and a portion formed of the second polymer are stacked.

4. The method of claim 1, wherein
the energy beam is selected from an electron beam and light.

5. The method of claim 1, wherein
the predetermined treatment includes heat treatment.

6. The method of claim 1, wherein
the first polymer is polymethyl methacrylate (PMMA) and the second polymer is polystyrene (PS).

7. The method of claim 1, wherein
a line-and-space pattern is formed by removing the first and second portions or removing the third portion.

8. The method of claim 1, wherein
a second pinning part having an affinity for the first polymer is formed by irradiating a second region of the neutral film with an energy beam, in forming the first pinning part; and
a pattern including fourth and fifth portions formed of the first polymer and a sixth portion provided between the fourth and fifth portions and formed of the second polymer is formed on the second pinning part, and a pattern including seventh and eighth portions formed of the second polymer and a ninth portion provided between the seventh and eighth portions and formed of the first polymer is formed between the first and second pinning parts, in forming the pattern including the first, second and third portions.

9. A pattern forming method comprising:
    forming, on an underlying region, a neutral film having an affinity for first and second polymers;
    forming first and second pinning parts having an affinity for the first polymer by irradiating first and second regions of the neutral film with an enemy beam;
    forming, on the neutral film including the first and second pinning parts, a block copolymer film containing the first and second polymers;
    forming a pattern formed of the first polymer, on the first pinning part, on the second pinning part and on a art provided between the first and second pinning arts and separated from the first and second pinning parts, by performing predetermined treatment for the block copolymer film to perform a microphase separation; and
    removing the pattern formed of the first polymer,
    wherein forming the neutral film includes:
        forming a preliminary neutral film; and
        thinning a portion of the preliminary neutral film, which is formed in the first and second regions.

10. The method of claim 9, wherein
the energy beam is selected from an electron beam and light.

11. The method of claim 9, wherein
the predetermined treatment includes heat treatment.

12. The method of claim 9, wherein
the first polymer is polymethyl methacrylate (PMMA) and the second polymer is polystyrene (PS).

13. The method of claim 9, wherein
a hole pattern is formed by removing the pattern formed of the first polymer.

14. A pattern forming method comprising:
    forming, on an underlying region, a neutral film having an affinity for first and second polymers;
    forming a first pinning part having an affinity for the first polymer by irradiating a first region of the neutral film with an energy beam;
    forming, on the neutral film including the first pinning part, a block copolymer film containing the first and second polymers;
    forming, on the first pinning part, a pattern including first and second portions formed of the first polymer and a third portion provided between the first and second portions and formed of the second polymer, by performing a predetermined treatment for the block copolymer film to perform a microphase separation; and
    removing the first and second portions or removing the third portion,
    wherein a horizontal lamella orientation section is formed in a predetermined region outside the first pinning part in performing the predetermined treatment for the block copolymer film.

15. The method of claim 14, wherein
a second pinning part having an affinity for the first polymer is formed by irradiating a second region of the neutral film with an energy beam, in forming the first pinning part; and
a pattern including fourth and fifth portions formed of the first polymer and a sixth portion provided between the fourth and fifth portions and formed of the second polymer is formed on the second pinning part, and a pattern including seventh and eighth portions formed of the second polymer and a ninth portion provided between the seventh and eighth portions and formed of the first polymer is formed between the first and second pinning parts, in forming the pattern including the first, second and third portions.

16. The method of claim 14, wherein
the horizontal lamella orientation section includes a structure in which a portion formed of the first polymer and a portion formed of the second polymer are stacked.

17. The method of claim 14, wherein
the energy beam is selected from an electron beam and light.
18. The method of claim 14, wherein
the predetermined treatment includes heat treatment.
19. The method of claim 14, wherein
the first polymer is polymethyl methacrylate (PMMA) and the second polymer is polystyrene (PS).
20. The method of claim 14, wherein
a line-and-space pattern is formed by removing the first and second portions or removing the third portion.

* * * * *